US008489395B2

(12) United States Patent
Li et al.

(10) Patent No.: US 8,489,395 B2
(45) Date of Patent: Jul. 16, 2013

(54) METHOD AND APPARATUS FOR GENERATING LATTICE VECTOR QUANTIZER CODEBOOK

(75) Inventors: Haiting Li, Beijing (CN); Deming Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/305,399

(22) Filed: Nov. 28, 2011

(65) Prior Publication Data

US 2012/0078618 A1    Mar. 29, 2012

Related U.S. Application Data

(63) Continuation of application No. PCT/CN2010/073121, filed on May 24, 2010.

(30) Foreign Application Priority Data

May 27, 2009    (CN) .......................... 2009 1 0203499

(51) Int. Cl.
*G10L 19/12*    (2006.01)
*G10L 19/00*    (2006.01)
*G10L 21/04*    (2006.01)
*G06K 9/00*    (2006.01)

(52) U.S. Cl.
USPC ........... 704/222; 704/223; 704/500; 704/501; 704/502; 704/503; 704/504; 382/253

(58) Field of Classification Search
USPC ................... 704/222, 223, 500–504; 382/253
See application file for complete search history.

(56) References Cited

U.S. PATENT DOCUMENTS

| 5,297,170 | A | * | 3/1994 | Eyuboglu et al. | ............. 375/242 |
| 5,384,725 | A |   | 1/1995 | Coifman et al. |   |
| 5,649,030 | A | * | 7/1997 | Normile et al. | ............... 382/253 |
| 5,734,791 | A | * | 3/1998 | Acero et al. | .................. 704/222 |

(Continued)

FOREIGN PATENT DOCUMENTS

| CN | 101303857 A | 11/2008 |
| CN | 101430881 A | 5/2009 |

(Continued)

OTHER PUBLICATIONS

Minjie Xie; Adoul, J.-P.; , "Embedded algebraic vector quantizers (EAVQ) with application to wideband speech coding," Acoustics, Speech, and Signal Processing, 1996. ICASSP-96. Conference Proceedings., 1996 IEEE International Conference on , vol. 1, no., pp. 240-243 vol. 1, May 7-10, 1996.*

(Continued)

*Primary Examiner* — Paras D Shah
(74) *Attorney, Agent, or Firm* — Brinks Hofer Gilson & Lione

(57) ABSTRACT

A method and an apparatus for generating a lattice vector quantizer codebook are disclosed. The method includes: storing an eigenvector set that includes amplitude vectors and/or length vectors, where the amplitude vectors and/or length vectors are different from each other and correspond to a root leader of a lattice vector quantizer; storing storage addresses of the amplitude vectors and length vectors, where the amplitude vectors and length vectors correspond to the root leader and are in the eigenvector set; and generating a lattice vector quantizer codebook according to the eigenvector set and the storage addresses.

8 Claims, 5 Drawing Sheets

U.S. PATENT DOCUMENTS

| | | | | |
|---|---|---|---|---|
| 6,205,256 | B1* | 3/2001 | Chaddha | 382/253 |
| 6,594,627 | B1* | 7/2003 | Goyal et al. | 704/222 |
| 6,728,413 | B2* | 4/2004 | Onno | 382/253 |
| 7,106,228 | B2* | 9/2006 | Bessette et al. | 341/106 |
| 7,587,314 | B2* | 9/2009 | Vasilache et al. | 704/222 |
| 7,966,175 | B2* | 6/2011 | Xie | 704/229 |
| 2002/0034333 | A1* | 3/2002 | Vishwanath et al. | 382/253 |
| 2003/0072494 | A1* | 4/2003 | Onno | 382/253 |
| 2007/0226444 | A1 | 9/2007 | Yagawa | |
| 2009/0175550 | A1* | 7/2009 | Taleb | 382/253 |
| 2009/0248406 | A1 | 10/2009 | Zhang et al. | |

FOREIGN PATENT DOCUMENTS

| | | |
|---|---|---|
| CN | 101572092 A | 11/2009 |
| CN | 101577551 A | 11/2009 |
| EP | 0 825 722 A1 | 2/1998 |
| EP | 1 514 355 A1 | 3/2005 |
| WO | 03/103151 A1 | 12/2003 |
| WO | 2005/083889 A1 | 9/2005 |
| WO | 2007/026295 A2 | 3/2007 |
| WO | 2009/059557 A1 | 5/2009 |

OTHER PUBLICATIONS

Linde, Yoseph, Andres Buzo, and Robert Gray. "An algorithm for vector quantizer design." Communications, IEEE Transactions on 28.1 (1980): 84-95.*

Gibson, Jerry D., and Khalid Sayood. "Lattice quantization." Advances in Electronics and Electron Physics 72 (1988): 259-330.*

Rault, Patrick, and Christine Guillemot. "Vector Indexing and Lattice Vector Quantization with Reduced or without Look-up Table." Journal article in preparation (1998).*

Office Action issued in corresponding European Patent Application No. 10 780 056.7; dated Jul. 5, 2012.

"Run Length Encoding" Wikipedia. Jun. 11, 2008. Retrieved from Internet on Jun. 25, 2012.

Xie, Minhi et al. "Embedded Algebraic Vector Quantizers (EAVQ) with Application to Wideband Speech Coding" IEEE 1996.

Office Action issued in corresponding Chinese Patent Application No. 200910203499.5, mailed Nov. 1, 2010.

Office Action issued in corresponding Chinese Patent Application No. 200910203499.5, mailed Apr. 25, 2011.

International Search Report and Written Opinion of the International Searching Authority issued in corresponding PCT Patent Application No. PCT/CN2010/073121, mailed Sep. 2, 2010.

Laaksonen, "G.729-based Embedded Variable Bit-Rate Coder: An 8-32 kbit/s Scalable Wideband Coder Bitstream Interoperable with G.729: New Annex E on Superwideband Scalable Extension for G.729.1" Draft New ITU-T Rec. G729.1 Amendment 6 (ex G.729.1-SWB) 2006.

Office Action issued in corresponding Chinese Patent Application No. 200910203499.5, mailed Jul. 5, 2012.

Reexamination Decision issued in corresponding Chinese Patent Application No. 200910203499.5, mailed Sep. 27, 2012.

Office Action issued in corresponding European Patent Application No. 10780056.7, mailed Apr. 9, 2013.

* cited by examiner

US 8,489,395 B2

METHOD AND APPARATUS FOR GENERATING LATTICE VECTOR QUANTIZER CODEBOOK

CROSS-REFERENCE TO RELATED APPLICATIONS

This application is a continuation of International Application No. PCT/CN2010/073121, filed on May 24, 2010, which claims priority to Chinese Patent Application No. 200910203499.5, filed on May 27, 2009, both of which are hereby incorporated by reference in their entireties.

FIELD OF THE INVENTION

The present invention relates to the field of communication technologies, and in particular, to a method and an apparatus for generating a lattice vector quantizer codebook.

BACKGROUND OF THE INVENTION

In recent years, with the development of bearer technologies, the coding quality of audio coders becomes more and more satisfying to people's requirements. Currently, most of the standardized audio coders encode signals by combining the transform coding technology, the psychoacoustic model, and the lattice vector quantization technology, for example, the Motion Picture Experts Group (MPEG) layer 3, Advanced Audio Coding (AAC) standard, and DolbyAC-3 standard. The transform coding technology and the lattice vector quantization technology are widely applicable in the broadband and Super Wide Band (SWB) voice field and the audio signal coding field. Lattice vector quantization is a type of algebraic vector quantization. Lattice vector quantization makes up a regular lattice in a multi-dimensional signal space. The points in the lattice are called "lattice points". The signal space is divided into cells by using the lattice points as quantization vectors.

A method for generating a lattice vector quantizer codebook is put forward in the prior art. For example, the method can be implemented through an N-dimensional (N≧2) multi-rate Gosset lattice vector quantizer. The quantizer includes M (M≧2) lattice vector quantizers, each of which has a different Number of Code Bits (NCB). If the codebook corresponding to the lattice vector quantizer of the NCB numbered i (NCB$_i$) is expressed as $Q_{R_i}^N$, i∈[0,M−1], the codebook of the whole N-dimensional multi-rate lattice vector quantizer is $Q\{Q_{R_0}^N, Q_{R_1}^N, \ldots, Q_{R_{M-1}}^N\}$. The codebook of a Gosset lattice vector quantizer may be generated out of some basic root leader vectors through transformation of the signs and positions of the elements. Therefore, under each lattice vector quantizer of a specified NCB in the N-dimensional multi-rate Gosset lattice vector quantizer, the codebook is generated through the stored root leader vector. A more detailed implementation process is: First, the amplitude vector and the length vector corresponding to the root leader vector under the lattice vector quantizer of each specified NCB are stored; the amplitude vector represents the values of different nonzero elements in the corresponding vector, where the values of the elements are arranged in descending order; the length vector represents the count of occurrences of each nonzero element value in the corresponding vector. The root leader vector is calculated according to the amplitude vector and length vector corresponding to the root leader vector, and the codebook of the lattice vector quantizer of each specified NCB is generated according to transformation of the signs and positions of elements of the root leader vector.

Supposing that the codebook corresponding to the lattice vector quantizer of NCB$_i$ is expressed as $Q_{R_i}^N$, this codebook may be generated through L$_i$ root leader vectors. The root leader vector numbered k may be calculated according to the corresponding amplitude vector $\mu^{(i,k)} = \lfloor \mu_0^{(i,k)} \; \mu_1^{(i,k)} \; \ldots \; \mu_{L_P^{(i,k)}-1}^{(i,k)} \rfloor$ and length vector $W^{(i,k)} = \lfloor w_0^{(i,k)} \; w_1^{(i,k)} \; \ldots \; w_{L_P^{(i,k)}-1}^{(i,k)} \rfloor$, where k∈[0,L$_i$−1], and $L_P^{(i,k)}$ is the number of dimensions of the amplitude vector and length vector of the root leader vector numbered k corresponding to the lattice vector quantizer of NCB$_i$, and represents the number of elements with different values in the root leader vector. Therefore, the codebook of the whole N-dimensional multi-rate Gosset lattice vector quantizer may be represented by M two-dimensional amplitude vector tables and M two-dimensional length vector tables. The amplitude vector set corresponding to lattice vector quantization of the lattice vector quantizer of NCB$_0$ is $\{\mu^{(0,0)}, \mu^{(0,1)}, \ldots, \mu^{(0,k)}, \ldots, \mu^{(0,L_0-1)}\}$; the amplitude vector set corresponding to lattice vector quantization of the lattice vector quantizer of NCB$_1$ is $\{\mu^{(1,0)}, \mu^{(1,1)}, \ldots, \mu^{(1,k)}, \ldots, \mu^{(1,L_1-1)}\}$; the amplitude vector set corresponding to lattice vector quantization of the lattice vector quantizer of NCB$_i$ is $\{\mu^{(i,0)}, \mu^{(i,1)}, \ldots, \mu^{(i,k)}, \ldots, \mu^{(i,L_i-1)}\}$; and the amplitude vector set corresponding to lattice vector quantization of the lattice vector quantizer of NCB$_{M-1}$ is $\{\mu^{(M-1,0)}, \mu^{(M-1,1)}, \ldots, \mu^{(M-1,k)}, \ldots, \mu^{(M-1,L_{M-1}-1)}\}$, where $\mu^{(i,k)} = \lfloor \mu_0^{(i,k)} \mu_1^{(i,k)} \ldots \mu_{L_P^{(i,k)}-1}^{(i,k)} \rfloor$. The length vector set corresponding to lattice vector quantization of the lattice vector quantizer of NCB$_0$ is $\{W^{(0,0)}, W^{(0,1)}, \ldots, W^{(0,k)}, \ldots, W^{(0,L_0-1)}\}$; the length vector set corresponding to lattice vector quantization of the lattice vector quantizer of NCB$_1$ is $\{W^{(1,0)}, W^{(1,1)}, \ldots, W^{(1,k)}, \ldots, W^{(1,L_1-1)}\}$; the length vector set corresponding to lattice vector quantization of the lattice vector quantizer of NCB$_i$ is $\{W^{(i,0)}, W^{(i,1)}, \ldots, W^{(i,k)}, \ldots, W^{(i,L_i-1)}\}$; and the length vector set corresponding to lattice vector quantization of the lattice vector quantizer of NCB$_{M-1}$ is $\{W^{(M-1,0)}, W^{(M-1,1)}, \ldots, W^{(M-1,k)}, \ldots, W^{(M-1,L_{M-1}-1)}\}$, where $W^{(i,k)} = \lfloor w_0^{(i,k)} \; w_1^{(i,k)} \; \ldots \; w_{L_P^{(i,k)}-1}^{(i,k)} \rfloor$. Therefore, the total storage capacity is $$2 \sum_{i=0}^{M-1} \sum_{k=0}^{L_i-1} L_P^{(i,k)}.$$

In the foregoing process, when a quantizer includes many lattice vector quantizers of different NCBs and each NCB corresponds to many root leader vectors, the storage overhead of the amplitude vectors and length vectors is very heavy, which leads to a waste of the storage space.

SUMMARY OF THE INVENTION

Embodiments of the present invention provide a method and an apparatus for generating a lattice vector quantizer codebook to overcome the occupation of a large storage space and too many storage overheads in the process of generating the lattice vector quantizer codebook in the prior art.

To solve the preceding technical problems, an embodiment of the present invention provides a method for generating a lattice vector quantizer codebook, where the method includes:

storing an eigenvector set that includes amplitude vectors and/or length vectors, where the amplitude vectors and/or length vectors are different from each other and correspond to a root leader of a lattice vector quantizer;

storing storage addresses of the amplitude vectors and length vectors located in the eigenvector set, where the amplitude vectors and length vectors correspond to the root leader; and generating a lattice vector quantizer codebook according to the eigenvector set and the storage addresses.

An embodiment of the present invention provides an apparatus for generating a lattice vector quantizer codebook, where the apparatus includes:

a first storing module, configured to store an eigenvector set that includes amplitude vectors and/or length vectors, where the amplitude vectors and/or length vectors are different from each other and correspond to a root leader of a lattice vector quantizer;

a second storing module, configured to store storage addresses of the amplitude vectors and length vectors located in the eigenvector set, where the amplitude vectors and length vectors correspond to the root leader; and a generating module, configured to generate a lattice vector quantizer codebook according to the eigenvector set and the storage addresses.

The embodiments of the present invention bring the following benefits:

In the embodiments of the present invention, the method or apparatus stores the eigenvector set that includes amplitude vectors and/or length vectors, where the amplitude vectors and/or length vectors are different from each other and correspond to the root leader of the lattice vector quantizer, stores the storage addresses of the amplitude vectors and length vectors located in the eigenvector set, where the amplitude vectors and length vectors correspond to the root leader, and generates the lattice vector quantizer codebook according to the eigenvector set and the storage addresses. By making use of the codebook correlation between the lattice vector quantizers of different NCBs, the method or apparatus stores only the eigenvectors which vary between the lattice vector quantizers of different NCBs, thus reducing the storage overhead of the multi-rate coding lattice vector quantizer in the process of generating the codebook.

BRIEF DESCRIPTION OF THE DRAWINGS

To make the technical solutions in the embodiments of the present invention or in the prior art clearer, the following outlines the accompanying drawings involved in the description of the embodiments of the present invention or the prior art. Apparently, the accompanying drawings outlined below are illustrative and not exhaustive, and persons of ordinary skill in the art can derive other drawings from such accompanying drawings without creative efforts.

DETAILED DESCRIPTION OF THE EMBODIMENTS

The following detailed description is given with reference to the accompanying drawings to provide a thorough understanding of the technical solutions in the embodiments of the present invention. Evidently, the drawings and the detailed description are merely representative of particular embodiments of the present invention, and the embodiments are illustrative in nature and not exhaustive. All other embodiments, which can be derived by those of ordinary skill in the art from the embodiments given herein without creative efforts, shall fall within the scope of the present invention.

To make the objectives, features and merits of the technical solutions of the present invention clearer, the following describes the embodiments of the present invention in detail with reference to the accompanying drawings.

Figure 1:
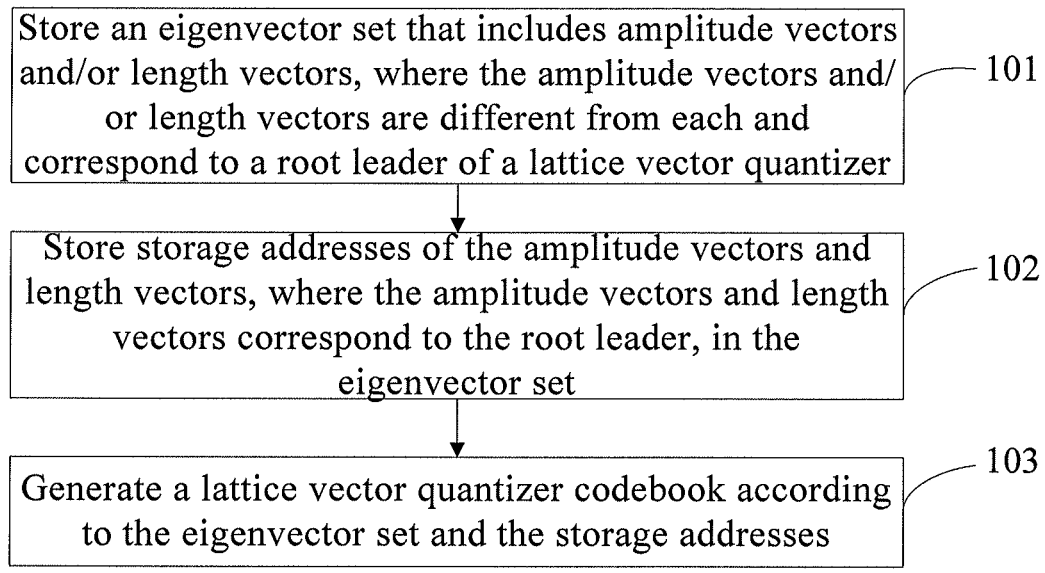
FIG. 1 is a flowchart of a method for generating a lattice vector quantizer codebook according to a first embodiment of the present invention.

As shown in FIG. 1, the method provided in the first embodiment of the present invention may include the following steps:

In this embodiment, the lattice vector quantizer may be a multi-rate lattice vector quantizer or a single-rate lattice vector quantizer. For example, an N-dimensional ($N \geq 2$) multi-rate Gosset lattice vector quantizer includes M lattice vector quantizers ($M \geq 2$), each of which has a different NCB; if the codebook corresponding to the lattice vector quantizer of $NCB_i$ is expressed as $Q_{R_i}^N$, where $i \in [0, M-1]$, the codebook of the whole N-dimensional multi-rate lattice vector quantizer is $Q\{Q_{R_0}^N, Q_{R_1}^N, \ldots, Q_{R_{M-1}}^N\}$. It should be noted that the codebook of the Gosset lattice vector quantizer is generated out of some basic root leader vectors through transformation of the signs and positions of elements. The detailed process is: The signs of the elements in each root leader vector are transformed to form a series of leader vectors, and then the positions of the elements in each leader vector are transformed to form the whole codebook finally. The elements in a root leader vector are non-negative numbers, and are arranged in descending order.

Step 101: Store an eigenvector set that includes amplitude vectors and/or length vectors, where the amplitude vectors and/or length vectors are different from each other and correspond to a root leader of a lattice vector quantizer.

In this embodiment, the eigenvector set includes the amplitude vectors and/or length vectors, where the amplitude vectors and/or length vectors are different from each other and correspond to the root leaders. In practice, the amplitude vector corresponding to the root leader vector represents the values of different nonzero elements in the corresponding root leader vector, and the values of the elements are arranged in descending order. The length vector corresponding to the root leader vector represents the count of occurrences of each nonzero element value in the corresponding root leader vector. Supposing that the codebook corresponding to the lattice vector quantizer of $NCB_i$ is $Q_{R_i}^N$, the codebook may be generated through $L_i$ root leader vectors. The root leader vector numbered k may be calculated according to the corresponding amplitude vector $\mu^{(i,k)} = [\mu_0^{(i,k)} \, \mu_1^{(i,k)} \ldots \mu_{L_P^{(i,k)}-1}^{(i,k)}]$ and length vector $W^{(i,k)} = [w_0^{(i,k)} \, w_1^{(i,k)} \ldots w_{L_P^{(i,k)}-1}^{(i,k)}]$, where $k \in [0, L_i-1]$, and $L_P^{(i,k)}$ is the number of dimensions of the amplitude vector and length vector of the root leader vector numbered k corresponding to the lattice vector quantizer of $NCB_i$, and represents the number of elements with different values in the root leader vector.

In this step, the content in the eigenvector set may be expressed as $\{x^{(0)}, x^{(1)}, \ldots, x^{(j)}, \ldots, x^{(L_\mu-1)}, y^{(0)}, y^{(1)}, \ldots, y^{(j)}, \ldots, y^{(L_w-1)}\}$. The lattice vector quantizer stores the eigenvector set, namely, stores the different amplitude vectors and/or length vectors.

Step 102: Store the storage addresses of the amplitude vectors and length vectors, where the amplitude vectors and length vectors correspond to the root leader and are in the eigenvector set.

It is necessary to store the storage addresses of all amplitude vectors and length vectors of the root leader according to the eigenvector set. At the time of calculating the complete length vector set or amplitude vector set corresponding to the lattice vector quantizer of each NCB, the length vector set and the amplitude vector set corresponding to the lattice vector quantizer of each NCB can be obtained according to the length vectors and/or amplitude vectors stored in the eigenvector set and the storage addresses of all amplitude vectors and/or length vectors.

For example, the eigenvector set is $\{x^{(0)}, x^{(1)}, \ldots, x^{(j)}, \ldots, x^{(L_\mu-1)}, y^{(0)}, y^{(1)}, \ldots, y^{(j)}, \ldots, y^{(L_w-1)}\}$. The lattice vector quantizer whose NCB is R1 includes two root leader vectors. The length vector corresponding to the root leader vector numbered 0 is the same as $x^{(2)}$, and the amplitude vector corresponding to the root leader vector numbered 0 is the same as $y^{(1)}$; the length vector corresponding to the root leader vector numbered 1 is the same as $y^{(2)}$, and the amplitude vector corresponding to the root leader vector numbered 1 is the same as $x^{(1)}$. Therefore, $\{\& (x^{(2)}), \& (y^{(1)})\}$ is the storage address of all amplitude vectors of the root leader of the lattice vector quantizer whose NCB is R1, and $\{\& (y^{(1)}), \& (x^{(1)})\}$ is the storage address of all length vectors.

It should be noted that before step 101, the following step may be included:

Step A: Obtain the eigenvector set corresponding to the root leader of the lattice vector quantizer.

In practice, step A may be: obtaining the amplitude vectors and/or length vectors corresponding to the root leader of the lattice vector quantizer that satisfies a decision condition. Specifically, step A may include any one or combination of the following:

Substep A1: Obtain different amplitude vectors corresponding to the root leader of the lattice vector quantizers of different NCBs.

Specifically, the process of obtaining different amplitude vectors may be: among all amplitude vectors of the root leader vector, compare one amplitude vector with another; if an amplitude vector is not the same as other amplitude vectors, this amplitude vector is obtained; if an amplitude vector is the same as another, this amplitude vector is not processed. After all the amplitude vectors are compared, the different amplitude vectors of the root leader vector corresponding to different NCBs are obtained.

It should be noted that the specific condition of the six substeps in this embodiment may serve as a decision condition. That is, the decision condition in the substep is "the amplitude vector corresponding to the root leader varies between the lattice vector quantizers of different NCBs". The following substeps may be deduced by analogy.

Substep A2: Obtain different length vectors corresponding to the root leader vector of the lattice vector quantizers of different NCBs.

Substep A3: Obtain different amplitude vectors corresponding to the root leader vector of the lattice vector quantizers of the same NCB.

Substep A4: Obtain different length vectors corresponding to the root leader vector of the lattice vector quantizers of the same NCB.

Substep A5: Obtain different amplitude vectors and length vectors, where the different amplitude vectors and length vectors correspond to the root leader vector of the lattice vector quantizers of the same NCB.

Substep A6: Obtain different amplitude vectors and length vectors, where the different amplitude vectors and length vectors correspond to the root leader vector of the lattice vector quantizers of different NCBs.

It should be noted that when at least two of the six substeps are applied, the at least two substeps are not order-sensitive. The present invention does not restrict the order of the at least two substeps.

Finally, $L_\mu$ amplitude vectors independent of each other are obtained to form $\{x^{(0)}, x^{(1)}, \ldots, x^{(j)}, \ldots, x^{(L_\mu-1)}\}$, $L_w$ length vectors independent of each other are obtained to form $\{y^{(0)}, y^{(1)}, \ldots, y^{(j)}, \ldots, y^{(L_w-1)}\}$, and the union of them is the eigenvector set. The eigenvector set may be expressed as $\{x^{(0)}, x^{(1)}, \ldots, x^{(j)}, \ldots, x^{(L_\mu-1)}, y^{(0)}, y^{(1)}, \ldots, y^{(j)}, \ldots, y^{(L_w-1)}\}$. The N-dimensional multi-rate Gosset lattice vector quantizer of M different NCBs needs to store only the eigenvector set and the storage addresses of all amplitude vectors and length vectors, where the all amplitude vectors and length vectors correspond to the root leader of the lattice vector quantizer. Finally, the codebook corresponding to the lattice vector quantizers of different NCBs can be generated according to the eigenvector set and the storage addresses.

For example, the eigenvector can be obtained through substeps A1, A2, A3 and A4, and $L_\mu$ amplitude vectors independent of each other are obtained to form $\{x^{(0)}, x^{(1)}, \ldots, x^{(L_\mu-1)}\}$ and $L_w$ length vectors independent of each other are obtained to form $\{y^{(0)}, y^{(1)}, \ldots, y^{(L_w-1)}\}$. The amplitude vectors or length vectors differ from each other no matter whether the NCB is different or the same. At the time of obtaining the eigenvector through the substeps, the amplitude vectors and length vectors need to fulfill both of the following two conditions simultaneously:

if $a \neq b$ and $a,b \in [0, L_\mu], x^{(a)} \neq x^{(b)}$; and if $c \neq d$ and $c,d \in [0, L_w], y^{(c)} \neq y^{(d)}$.

Alternatively, if the eigenvector is obtained through substeps A1, A2, A3, A4, A5 and A6, $L_\mu$ amplitude vectors independent of each other are obtained to form $\{x^{(0)}, x^{(1)}, \ldots, x^{(L_\mu-1)}\}$ and $L_w$ length vectors independent of each other are obtained to form $\{y^{(0)}, y^{(1)}, \ldots, y^{(L_w-1)}\}$. The amplitude vectors or length vectors differ from each other no matter whether the NCB is different or the same. The amplitude vectors and length vectors need to fulfill the following three conditions simultaneously:

if $a \neq b$ and $a,b \in [0, L_\mu], x^{(a)} \neq x^{(b)}$; and if $c \neq d$ and $c,d \in [0, L_w], y^{(c)} \neq y^{(d)}$; and if $e \neq f$, $e \in [0, L_\mu]$ and $f \in [0, L_w], x^{(e)} \neq y^{(f)}$.

It is evident that the obtained eigenvector set is the intersection of the vector sets obtained in the substeps.

It should be noted that if the performed steps include at least one of the substep A5 and substep A6, in some circumstances, the obtained eigenvector set may include only amplitude vectors or include only length vectors.

Step 103: Generating a lattice vector quantizer codebook according to the eigenvector set and the storage addresses.

In this step, the amplitude vectors and length vectors, where the amplitude vectors and length vectors correspond to the root leader vector of the lattice vector quantizer of each NCB, can be generated according to the eigenvector set and the storage addresses; the corresponding root leader vector can be calculated according to the amplitude vectors and length vectors, where the amplitude vectors and length vectors correspond to the root leader vector of the lattice vector quantizer of each NCB; and the signs and positions of the elements of the root leader vector can be transformed in different ways to generate a codebook of the lattice vector quantizer of each specified NCB. For example, $\{x^{(0)}, x^{(1)}, \ldots, x^{(j)}, \ldots, x^{(L_\mu-1)}, y^{(0)}, y^{(1)}, \ldots, y^{(j)}, \ldots, y^{(L_w-1)}\}$ is an eigenvector set; $\{\&\ (x^{(2)}),\ \&\ (y^{(1)})\}$ is a set of storage addresses of all amplitude vectors corresponding to the root leader of the lattice vector quantizer whose NCB is R1, and $\{\&\ (y^{(1)}),\ \&\ (x^{(1)})\}$ is a set of storage addresses of all length vectors, where "&( )" refers to an operation of obtaining an address. Therefore, for the root leader of the lattice vector quantizer whose NCB is R1, the amplitude vector set is $\{x^{(2)}, y^{(1)}\}$ and the length vector set is $\{y^{(1)}, x^{(1)}\}$. In the same way, the amplitude vector set and the length vector set corresponding to the root leader vector of the lattice vector quantizer of each NCB are obtained, and then the corresponding root leader vectors are generated according to the amplitude vector set and the length vector set. Finally, the codebook is generated.

In this embodiment, supposing that the number of dimensions of the eigenvector numbered i is $L_P^{(i)}$, because the storage addresses occupy a relatively small space which is ignorable in contrast to the total storage capacity, the total storage capacity in this embodiment is $$\sum_{i=0}^{L_\mu+L_w-1} L_P^{(i)}.$$

Compared with the codebook storage size $$2\sum_{i=0}^{M-1}\sum_{k=0}^{L_i-1} L_P^{(i,k)}$$

in the prior art, the storage overhead in this embodiment is reduced drastically.

In this embodiment, by making use of the codebook correlation between the lattice vector quantizers of different NCBs, the method stores only the eigenvectors which vary between the lattice vector quantizers of different NCBs, thus reducing the storage overhead of the multi-rate coding lattice vector quantizer.

Figure 2:
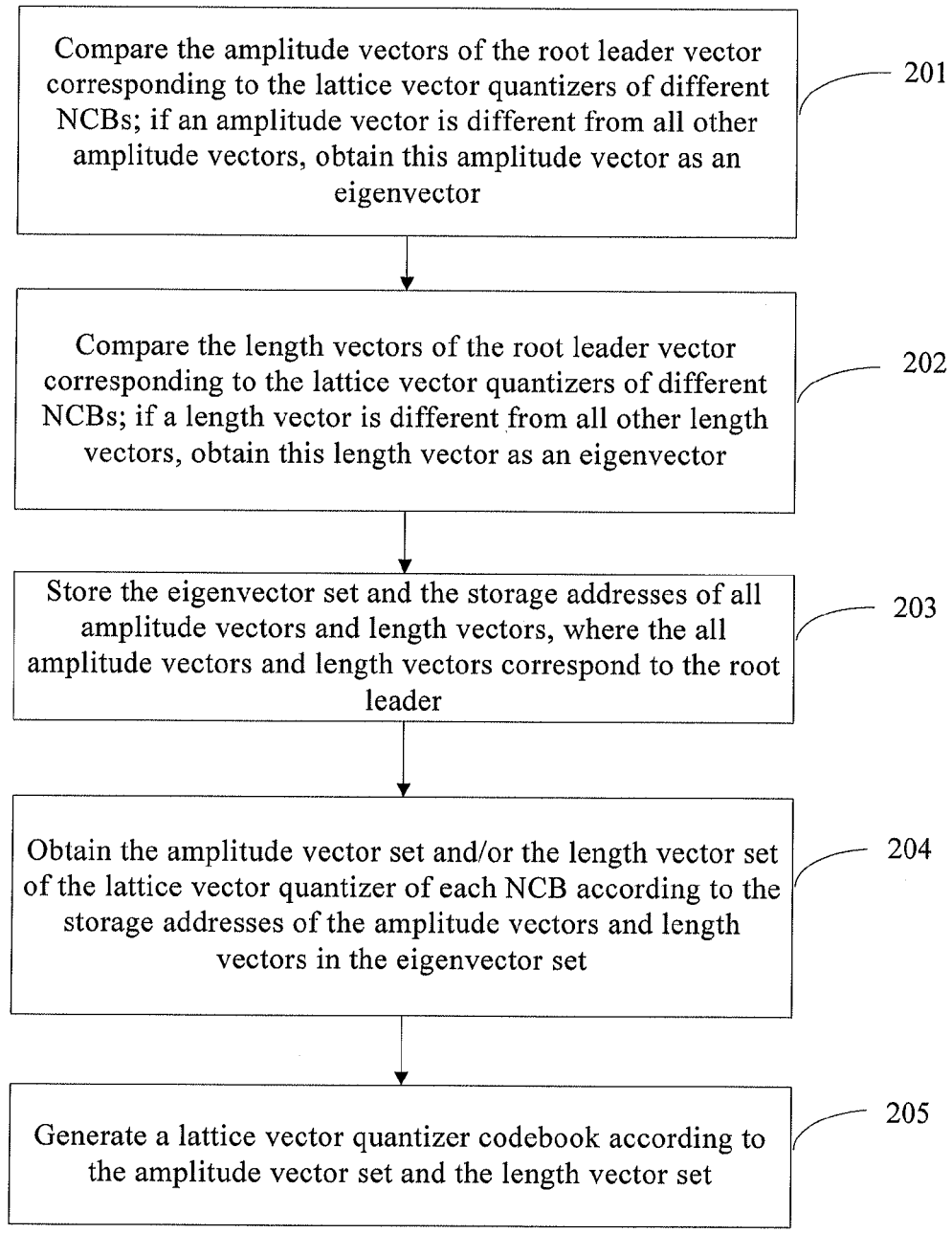
FIG. 2 is a flowchart of a method for generating a lattice vector quantizer codebook according to a second embodiment of the present invention.

As shown in FIG. 2, the method provided in the second embodiment of the present invention may include the following steps:

In this embodiment, the 16-dimensional multi-rate Gosset lattice vector quantizer is taken as an example. The quantizer includes eight different NCBs: 9 bits, 16 bits, 21 bits, 23 bits, 26 bits, 28 bits, 30 bits, and 32 bits. The codebook of the lattice vector quantizer of each NCB can be generated out of the corresponding root leader vector through transformation of positions and signs of elements. The root leader vector can be expressed by amplitude vectors and length vectors.

In the Gosset lattice vector quantizer, there is 1 root leader vector whose NCB is 9: the amplitude vector corresponding to this root leader vector is $\mu^{(0,0)}=\{2\}$, and the length vector corresponding to this root leader vector is $W^{(0,0)}=\{2\}$.

In the Gosset lattice vector quantizer, there are 3 root leader vectors whose NCB is 16: The amplitude vector corresponding to the root leader vector numbered 0 is $\mu^{(1,0)}=\{4\}$, and the length vector corresponding to the root leader vector numbered 0 is $W^{(1,0)}=\{1\}$; the amplitude vector corresponding to the root leader vector numbered 1 is $\mu^{(1,1)}=\{2\}$, and the length vector corresponding to the root leader vector numbered 1 is $W^{(1,1)}=\{4\}$; the amplitude vector corresponding to the root leader vector numbered 2 is $\mu^{(1,2)}=\{1\}$, and the length vector corresponding to the root leader vector numbered 2 is $W^{(1,2)}=\{16\}$.

In the Gosset lattice vector quantizer, there are 3 root leader vectors whose NCB is 21: The amplitude vector corresponding to the root leader vector numbered 0 is $\mu^{(2,0)}=\{4,2\}$, and the length vector corresponding to the root leader vector numbered 0 is $W^{(2,0)}=\{1,2\}$; the amplitude vector corresponding to the root leader vector numbered 1 is $\mu^{(2,1)}=\{2\}$, and the length vector corresponding to the root leader vector numbered 1 is $W^{(2,1)}=\{6\}$; the amplitude vector corresponding to the root leader vector numbered 2 is $\mu^{(2,2)}=\{3,1\}$, and the length vector corresponding to the root leader vector numbered 2 is $W^{(2,2)}=\{1,15\}$.

In the Gosset lattice vector quantizer, there are 4 root leader vectors whose NCB is 23: The amplitude vector corresponding to the root leader vector numbered 0 is $\mu^{(3,0)}=\{4\}$, and the length vector corresponding to the root leader vector numbered 0 is $W^{(3,0)}=\{2\}$; the amplitude vector corresponding to the root leader vector numbered 1 is $\mu^{(3,1)}=\{4,2\}$, and the length vector corresponding to the root leader vector numbered 1 is $W^{(3,1)}=\{1,4\}$; the amplitude vector corresponding to the root leader vector numbered 2 is $\mu^{(3,2)}=\{2\}$, and the length vector corresponding to the root leader vector numbered 2 is $W^{(3,2)}=\{8\}$; the amplitude vector corresponding to the root leader vector numbered 3 is $\mu^{(3,3)}=\{3,1\}$, and the length vector corresponding to the root leader vector numbered 3 is $W^{(3,3)}=\{2,14\}$.

In the Gosset lattice vector quantizer, there are 6 root leader vectors whose NCB is 26: The amplitude vector corresponding to the root leader vector numbered 0 is $\mu^{(4,0)}=\{6,2\}$, and the length vector corresponding to the root leader vector numbered 0 is $W^{(4,0)}=\{1,1\}$; the amplitude vector corresponding to the root leader vector numbered 1 is $\mu^{(4,1)}=\{4,2\}$, and the length vector corresponding to the root leader vector numbered 1 is $W^{(4,1)}=\{2,2\}$; the amplitude vector corresponding to the root leader vector numbered 2 is $\mu^{(4,2)}=\{4,2\}$, and the length vector corresponding to the root leader vector numbered 2 is $W^{(4,2)}=\{1,6\}$; the amplitude vector corresponding to the root leader vector numbered 3 is $\mu^{(4,3)}=\{5,1\}$, and the length vector corresponding to the root leader vector numbered 3 is $W^{(4,3)}=\{1,15\}$; the amplitude vector corresponding to the root leader vector numbered 4 is $\mu^{(4,4)}=\{2\}$, and the length vector corresponding to the root leader vector numbered 4 is $W^{(4,4)}=\{10\}$; the amplitude vector corresponding to the root leader vector numbered 5 is $\mu^{(4,5)}=\{3,1\}$, and the length vector corresponding to the root leader vector numbered 5 is $W^{(4,5)}=\{3,13\}$.

In the Gosset lattice vector quantizer, there are 7 root leader vectors whose NCB is 28: The amplitude vector corresponding to the root leader vector numbered 0 is $\mu^{(5,0)}=\{6,2\}$, and the length vector corresponding to the root leader vector numbered 0 is $W^{(5,0)}=\{1,3\}$; the amplitude vector corresponding to the root leader vector numbered 1 is $\mu^{(5,1)}=\{4\}$, and the length vector corresponding to the root leader vector numbered 1 is $W^{(5,1)}=\{3\}$; the amplitude vector corresponding to the root leader vector numbered 2 is $\mu^{(5,2)}=\{4,2\}$, and the length vector corresponding to the root leader vector numbered 2 is $W^{(5,2)}=\{2,4\}$; the amplitude vector corresponding to the root leader vector numbered 3 is $\mu^{(5,3)}=\{4,2\}$, and the length vector corresponding to the root leader vector numbered 3 is $W^{(5,3)}=\{1,8\}$; the amplitude vector corresponding to the root leader vector numbered 4 is $\mu^{(5,4)}=\{5,3,1\}$, and the length vector corresponding to the root leader vector numbered 4 is $W^{(5,4)}=\{1,1,14\}$; the amplitude vector corresponding to the root leader vector numbered 5 is $\mu^{(5,5)}=\{2\}$, and the length vector corresponding to the root leader vector numbered 5 is $W^{(5,5)}=\{12\}$; the amplitude vector corresponding to the root leader vector numbered 6 is $\mu^{(5,6)}=\{3,$ 1}, and the length vector corresponding to the root leader vector numbered 6 is $W^{(5,6)}=\{4,12\}$.

In the Gosset lattice vector quantizer, there are 12 root leader vectors whose NCB is 30: The amplitude vector corresponding to the root leader vector numbered 0 is $\mu^{(6,0)}=\{8\}$, and the length vector corresponding to the root leader vector numbered 0 is $W^{(6,0)}=\{1\}$; the amplitude vector corresponding to the root leader vector numbered 1 is $\mu^{(6,1)}=\{6,4,2\}$, and the length vector corresponding to the root leader vector numbered 1 is $W^{(6,1)}=\{1,1,3\}$; the amplitude vector corresponding to the root leader vector numbered 2 is $\mu^{(6,2)}=\{6,2\}$, and the length vector corresponding to the root leader vector numbered 2 is $W^{(6,2)}=\{1,7\}$; the amplitude vector corresponding to the root leader vector numbered 3 is $\mu^{(6,3)}=\{1,15\}$, and the length vector corresponding to the root leader vector numbered 3 is $W^{(6,3)}=\{1,15\}$; the amplitude vector corresponding to the root leader vector numbered 4 is $\mu^{(6,4)}=\{4\}$, and the length vector corresponding to the root leader vector numbered 4 is $W^{(6,4)}=\{4\}$; the amplitude vector corresponding to the root leader vector numbered 5 is $\mu^{(6,5)}=\{4,2\}$, and the length vector corresponding to the root leader vector numbered 5 is $W^{(6,5)}=\{3,4\}$; the amplitude vector corresponding to the root leader vector numbered 6 is $\mu^{(6,6)}=\{4,2\}$, and the length vector corresponding to the root leader vector numbered 6 is $W^{(6,6)}=\{2,8\}$; the amplitude vector corresponding to the root leader vector numbered 7 is $\mu^{(6,7)}=\{4,2\}$, and the length vector corresponding to the root leader vector numbered 7 is $W^{(6,7)}=\{1,12\}$; the amplitude vector corresponding to the root leader vector numbered 8 is $\mu^{(6,8)}=\{5,1\}$, and the length vector corresponding to the root leader vector numbered 8 is $W^{(6,8)}=\{2,14\}$; the amplitude vector corresponding to the root leader vector numbered 9 is $\mu^{(6,9)}=\{5,3,1\}$, and the length vector corresponding to the root leader vector numbered 9 is $W^{(6,9)}=\{1,3,12\}$; the amplitude vector corresponding to the root leader vector numbered 10 is $\mu^{(6,10)}=\{2\}$, and the length vector corresponding to the root leader vector numbered 10 is $W^{(6,10)}=\{16\}$; the amplitude vector corresponding to the root leader vector numbered 11 is $\mu^{(6,11)}=\{3,1\}$, and the length vector corresponding to the root leader vector numbered 11 is $W^{(6,11)}=\{6,10\}$.

In the Gosset lattice vector quantizer, there are 13 root leader vectors whose NCB is 32: The amplitude vector corresponding to the root leader vector numbered 0 is $\mu^{(7,0)}=\{8,2\}$, and the length vector corresponding to the root leader vector numbered 0 is $W^{(7,0)}=\{1,2\}$; the amplitude vector corresponding to the root leader vector numbered 1 is $\mu^{(7,1)}=\{6\}$, and the length vector corresponding to the root leader vector numbered 1 is $W^{(7,1)}=\{2\}$; the amplitude vector corresponding to the root leader vector numbered 2 is $\mu^{(7,2)}=\{6,4,2\}$, and the length vector corresponding to the root leader vector numbered 2 is $W^{(7,2)}=\{1,2,1\}$; the amplitude vector corresponding to the root leader vector numbered 3 is $\mu^{(7,3)}=\{6,4,2\}$, and the length vector corresponding to the root leader vector numbered 3 is $W^{(7,3)}=\{1,1,15\}$; the amplitude vector corresponding to the root leader vector numbered 4 is $\mu^{(7,4)}=\{6,2\}$, and the length vector corresponding to the root leader vector numbered 4 is $W^{(7,4)}=\{1,9\}$; the amplitude vector corresponding to the root leader vector numbered 5 is $\mu^{(7,5)}=\{7,3,1\}$, and the length vector corresponding to the root leader vector numbered 5 is $W^{(7,5)}=\{1,1,14\}$; the amplitude vector corresponding to the root leader vector numbered 6 is $\mu^{(7,6)}=\{4,2\}$, and the length vector corresponding to the root leader vector numbered 6 is $W^{(7,6)}=\{4,2\}$; the amplitude vector corresponding to the root leader vector numbered 7 is $\mu^{(7,7)}=\{4,2\}$, and the length vector corresponding to the root leader vector numbered 7 is $W^{(7,7)}=\{3,6\}$; the amplitude vector corresponding to the root leader vector numbered 8 is $\mu^{(7,8)}=\{4,2\}$, and the length vector corresponding to the root leader vector numbered 8 is $W^{(7,8)}=\{2,10\}$; the amplitude vector corresponding to the root leader vector numbered 9 is $\mu^{(7,9)}=\{4,2\}$, and the length vector corresponding to the root leader vector numbered 9 is $W^{(7,9)}=\{1,14\}$, the amplitude vector corresponding to the root leader vector numbered 10 is $\mu^{(7,10)}=\{5,3,1\}$, and the length vector corresponding to the root leader vector numbered 10 is $W^{(7,10)}=\{2,1,13\}$; the amplitude vector corresponding to the root leader vector numbered 11 is $\mu^{(7,11)}=\{5,3,1\}$, and the length vector corresponding to the root leader vector numbered 11 is $W^{(7,11)}=\{1,4,11\}$; the amplitude vector corresponding to the root leader vector numbered 12 $\mu^{(7,12)}=\{3,1\}$, and the length vector corresponding to the root leader vector numbered 12 $W^{(7,12)}=\{7,9\}$.

Step 201: Compare the amplitude vectors of the root leader vector corresponding to the lattice vector quantizers of different NCBs. If an amplitude vector is different from all other amplitude vectors, obtain this amplitude vector as an eigenvector.

For example, in this embodiment, in the amplitude vectors of the root leader vector corresponding to the lattice vector quantizers of different NCBs, $\mu^{(0,0)}$, $\mu^{(1,1)}$, $\mu^{(2,1)}$, $\mu^{(3,2)}$, $\mu^{(4,4)}$, and $\mu^{(5,5)}$ are the same. Therefore, only $\mu^{(0,0)}$ is obtained as an eigenvector. By analogy, the same amplitude vectors of the root leader vector corresponding to the lattice vector quantizers of different NCBs are found. Finally, 14 mutually independent amplitude vectors are obtained: $\{\mu^{(0,0)}, \mu^{(1,0)}, \mu^{(1,2)}, \mu^{(2,0)}, \mu^{(2,2)}, \mu^{(4,0)}, \mu^{(4,3)}, \mu^{(5,4)}, \mu^{(6,0)}, \mu^{(6,1)}, \mu^{(6,3)}, \mu^{(7,0)}, \mu^{(7,1)}, \mu^{(7,5)}\}$.

It should be noted that evidently, the decision condition in this step is "the amplitude vector of the root leader vector varies between the lattice vector quantizers of different NCBs". The following step may be deduced by analogy.

Step 202: Compare the length vectors of the root leader vector corresponding to the lattice vector quantizers of different NCBs. If a length vector is different from all other length vectors, obtain this length vector as an eigenvector.

Moreover, in this embodiment, in the length vectors of the root leader vector corresponding to the lattice vector quantizers of different NCBs, $W^{(0,0)}$, $W^{(3,0)}$, and $W^{(7,1)}$ are the same. Therefore, only $W^{(0,0)}$ is obtained as an eigenvector. By analogy, the same length vectors of the root leader vector corresponding to the lattice vector quantizers of different NCBs are found. Finally, 39 mutually independent length vectors are obtained:

$\{W^{(0,0)}, W^{(1,0)}, W^{(1,1)}, W^{(1,2)}, W^{(2,0)}, W^{(2,1)}, W^{(2,2)}, W^{(3,1)},$
$W^{(3,2)}, W^{(3,3)}, W^{(4,0)}, W^{(4,1)}, W^{(4,2)}, W^{(4,4)}, W^{(4,5)},$
$W^{(5,0)}, W^{(5,1)}, W^{(5,2)}, W^{(5,3)}, W^{(5,4)}, W^{(5,5)}, W^{(5,6)},$
$W^{(6,1)}, W^{(6,2)}, W^{(6,5)}, W^{(6,6)}, W^{(6,7)}, W^{(6,9)}, W^{(6,11)},$
$W^{(7,2)}, W^{(7,3)}, W^{(7,4)}, W^{(7,6)}, W^{(7,7)}, W^{(7,8)}, W^{(7,9)},$
$W^{(7,10)}, W^{(7,11)}, W^{(7,12)}\}$

It should be noted that step 201 and step 202 may be performed simultaneously or any one of the two steps may be performed first. The preceding two steps are numbered here for ease of description. In practice, the two steps are not order-sensitive.

Step 203: Store the eigenvector set and the storage addresses of the amplitude vectors and length vectors, where the amplitude vectors and length vectors correspond to the root leader and are in the eigenvector set.

According to the results of step 201 and step 202 in this embodiment, when the 16-dimensional multi-rate Gosset lattice vector quantizer has eight different NCBs, only 14+39=53 eigenvectors need to be stored. The set of such eigenvectors is:

$\{\mu^{(0,0)}, \mu^{(1,0)}, \mu^{(1,2)}, \mu^{(2,0)}, \mu^{(2,2)}, \mu^{(4,0)}, \mu^{(4,3)}, \mu^{(5,4)}, \mu^{(6,0)}, \mu^{(6,1)}, \mu^{(6,3)}, \mu^{(7,0)}, \mu^{(7,1)}, \mu^{(7,5)}, W^{(0,0)}, W^{(1,0)}, W^{(1,1)}, W^{(1,2)}, W^{(2,0)}, W^{(2,1)}, W^{(2,2)}, W^{(3,1)}, W^{(3,2)}, W^{(3,3)}, W^{(4,0)}, W^{(4,1)}, W^{(4,2)}, W^{(4,4)}, W^{(4,5)}, W^{(5,0)}, W^{(5,1)}, W^{(5,2)}, W^{(5,3)}, W^{(5,4)}, W^{(5,5)}, W^{(5,6)}, W^{(6,1)}, W^{(6,2)}, W^{(6,5)}, W^{(6,6)}, W^{(6,7)}, W^{(6,9)}, W^{(6,11)}, W^{(7,2)}, W^{(7,3)}, W^{(7,4)}, W^{(7,6)}, W^{(7,7)}, W^{(7,8)}, W^{(7,9)}, W^{(7,10)}, W^{(7,11)}, W^{(7,12)}\}$

Therefore, the storage addresses of all amplitude vectors of the root leader under different NCBs are: The storage address of all amplitude vectors of the root leader with the NCB "9" is $\{\&(\mu^{(0,0)})\}$; the storage address of all amplitude vectors of the root leader with the NCB "16" is $\{\&(\mu^{(1,0)}), \&(\mu^{(0,0)}), \&(\mu^{(1,2)})\}$; the storage address of all amplitude vectors of the root leader with the NCB "21" is $\{\&(\mu^{(2,0)}), \&(\mu^{(0,0)}), \&(\mu^{(2,2)})\}$; the storage address of all amplitude vectors of the root leader with the NCB "23" is $\{\&(\mu^{(1,0)}), \&(\mu^{(2,0)}), \&(\mu^{(0,0)}), \&(\mu^{(2,2)})\}$; the storage address of all amplitude vectors of the root leader with the NCB "26" is $\{\&(\mu^{(4,0)}), \&(\mu^{(2,0)}), \&(\mu^{(2,0)}), \&(\mu^{(4,3)}), \&(\mu^{(0,0)}), \&(\mu^{(2,2)})\}$; the storage address of all amplitude vectors of the root leader with the NCB "28" is $\{\&(\mu^{(4,0)}), \&(\mu^{(1,0)}), \&(\mu^{(2,0)}), \&(\mu^{(2,0)}), \&(\mu^{(5,4)}), \&(\mu^{(0,0)}), \&(\mu^{(2,2)})\}$; the storage address of all amplitude vectors of the root leader with the NCB "30" is $\{\&(\mu^{(6,0)}), \&(\mu^{(6,1)}), \&(\mu^{(4,0)}), \&(\mu^{(6,3)}), \&(\mu^{(1,0)}), \&(\mu^{(2,0)}), \&(\mu^{(2,0)}), \&(\mu^{(2,0)}), \&(\mu^{(4,3)}), \&(\mu^{(5,4)}), \&(\mu^{(0,0)}), \&(\mu^{(2,2)})\}$; and the storage address of all amplitude vectors of the root leader with the NCB "32" is $\{\&(\mu^{(7,0)}), \&(\mu^{(7,1)}), \&(\mu^{(6,1)}), \&(\mu^{(4,0)}), \&(\mu^{(7,5)}), \&(\mu^{(2,0)}), \&(\mu^{(2,0)}), \&(\mu^{(2,0)}), \&(\mu^{(2,0)}), \&(\mu^{(2,0)}), \&(\mu^{(5,4)}), \&(\mu^{(2,2)})\}$, where "&( )" refers to the operation of obtaining an address.

Therefore, the storage addresses of all length vectors of the root leader with different NCBs are: The storage address of all length vectors of the root leader with the NCB "9" is $\{\&(W^{(0,0)})\}$; the storage address of all length vectors of the root leader with the NCB "16" is $\{\&(W^{(1,0)}), \&(W^{(1,1)}), \&(W^{(1,2)})\}$; the storage address of all length vectors of the root leader with the NCB "21" is $\{\&(W^{(2,0)}), \&(W^{(2,1)}), \&(W^{(2,2)})\}$; the storage address of all length vectors of the root leader with the NCB "23" is $\{\&(W^{(0,0)}), \&(W^{(3,1)}), \&(W^{(3,2)}), \&(W^{(3,2)})\}$; the storage address of all length vectors of the root leader with the NCB "26" is $\{\&(W^{(4,0)}), \&(W^{(4,1)}), \&(W^{(4,2)}), \&(W^{(2,2)}), \&(W^{(4,4)}), \&(W^{(4,5)})\}$; the storage address of all length vectors of the root leader with the NCB "28" is $\{\&(W^{(5,0)}), \&(W^{(5,1)}), \&(W^{(5,2)}), \&(W^{(5,3)}), \&(W^{(5,4)}), \&(W^{(5,5)}), \&(W^{(5,6)})\}$; the storage address of all length vectors of the root leader with the NCB "30" is $\{\&(W^{(1,0)}), \&(W^{(6,1)}), \&(W^{(6,2)}), \&(W^{(2,2)}), \&(W^{(1,1)}), \&(W^{(6,5)}), \&(W^{(6,6)}), \&(W^{(6,7)}), \&(W^{(3,3)}), \&(W^{(6,9)}), \&(W^{(1,2)}), \&(W^{(6,11)})\}$; and the storage address of all length vectors of the root leader with the NCB "32" is $\{\&(W^{(2,0)}), \&(W^{(0,0)}), \&(W^{(7,2)}), \&(W^{(7,3)}), \&(W^{(7,4)}), \&(W^{(5,4)}), \&(W^{(7,6)}), \&(W^{(7,7)}), \&(W^{(7,8)}), \&(W^{(7,9)}), \&(W^{(7,10)}), \&(W^{(7,11)}), \&(W^{(7,12)})\}$, where "&( )" refers to the operation of obtaining an address.

Step 204: Obtain the amplitude vector set and the length vector set of the lattice vector quantizer of each NCB according to the storage addresses of the amplitude vectors and length vectors in the eigenvector set.

In this step, the amplitude vector set and the length vector set corresponding to each of the eight NCBs are obtained according to the storage address of the eigenvector in the eigenvector set. For example, the amplitude vector set and the length vector set of the Gosset lattice vector quantizer of the NCB "16" are generated according to the eigenvector set, the storage address of the amplitude vector set corresponding to the Gosset lattice vector quantizer of this NCB is $\{\&(\mu^{(1,0)}), \&(\mu^{(0,0)}), \&(\mu^{(1,2)})\}$, and the storage address of the length vector is $\{\&(W^{(1,0)}), \&(W^{(1,1)}), \&(W^{(1,2)})\}$, where "&( )" refers to the operation of obtaining an address. Therefore, the amplitude vector set corresponding to the Gosset lattice vector quantizer of this NCB is $\{\mu^{(1,0)}, \mu^{(0,0)}, \mu^{(1,2)}\}$; and the length vector set is $\{W^{(1,0)}, W^{(1,1)}, W^{(1,2)}\}$.

Step 205: Generate the lattice vector quantizer codebook according to the amplitude vector set and the length vector set.

Finally, the codebooks corresponding to the lattice vector quantizers of different NCBs are generated according to the amplitude vector set and the length vector set. In practice, the root leader vector set under each NCB is obtained according to the amplitude vector set and the length vector set, and then the final codebooks are obtained according to the root leader vector set under each NCB.

In the prior art, if the amplitude vectors and length vectors, where the amplitude vectors and length vectors correspond to the root leader vector under each NCB, are stored directly, and the codebooks corresponding to different NCBs are generated according to the amplitude vectors and length vectors, it is necessary to store 49 amplitude vectors and 49 length vectors. In this embodiment, only 53 eigenvectors need to be stored, and the codebook corresponding to each NCB can be generated according to the 53 eigenvectors in the subsequent process of generating the codebook. Evidently, the eigenvector storage mode in this embodiment reduces the storage overhead of the lattice vector quantizer.

Figure 3:
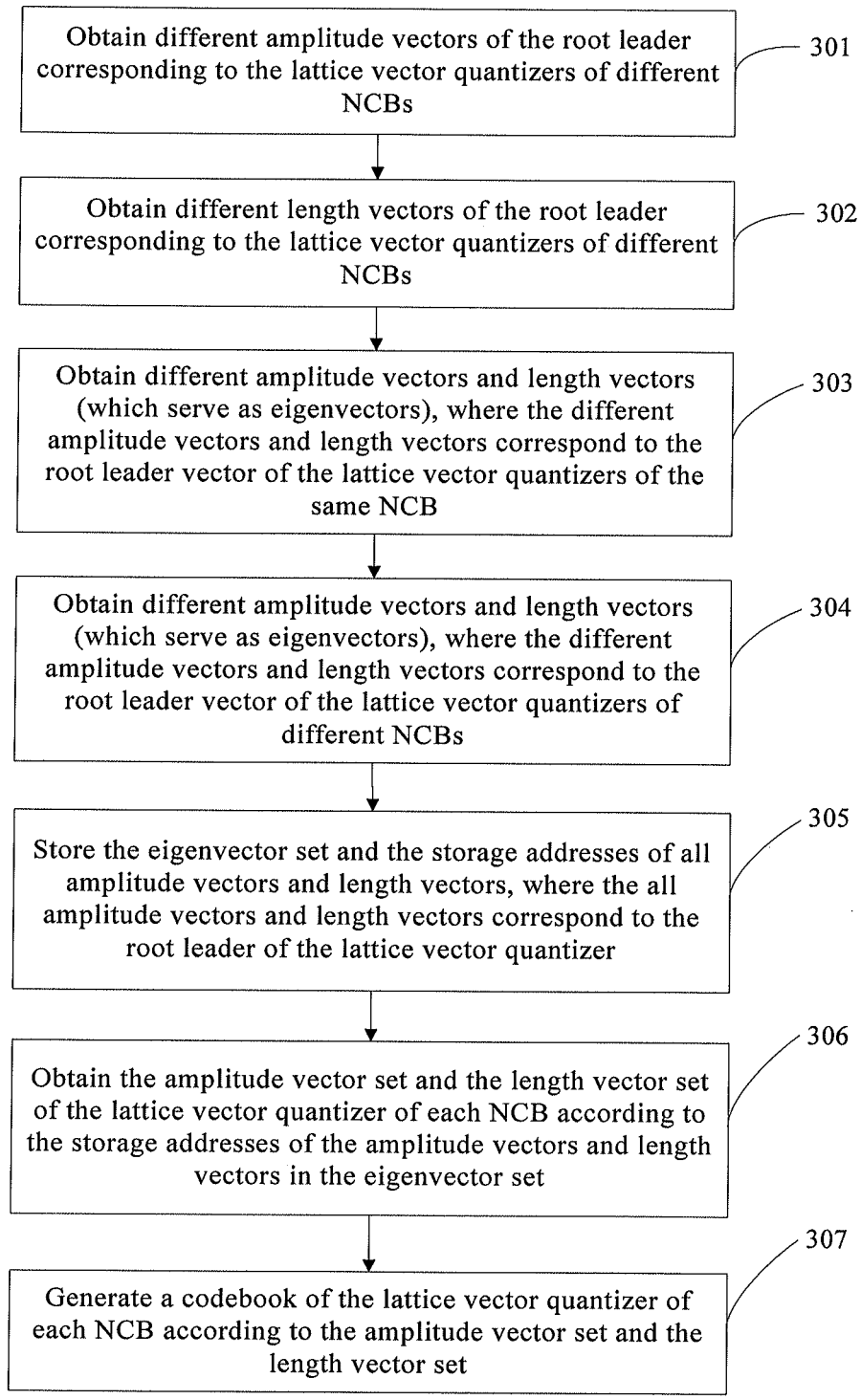
FIG. 3 is a flowchart of a method for generating a lattice vector quantizer codebook according to a third embodiment of the present invention.

As shown in FIG. 3, the method provided in the third embodiment of the present invention may include the following steps:

Step 301: Obtain different amplitude vectors corresponding to the root leader vector of the lattice vector quantizers of different NCBs.

In this embodiment, the 16-dimensional multi-rate Gosset lattice vector quantizer is still taken as an example. This quantizer is detailed in the second embodiment above.

For example, in this embodiment, in the amplitude vectors of the root leader vector corresponding to the lattice vector quantizers of different NCBs, $\mu^{(0,0)}, \mu^{(1,1)}, \mu^{(2,1)}, \mu^{(3,2)}, \mu^{(4,4)}$, and $\mu^{(5,5)}$ are the same. Therefore, only $\mu^{(0,0)}$ is obtained as an eigenvector. In this step, 14 amplitude vectors independent of each other are obtained: $\{\mu^{(0,0)}, \mu^{(1,0)}, \mu^{(1,2)}, \mu^{(2,0)}, \mu^{(2,2)}, \mu^{(4,0)}, \mu^{(4,3)}, \mu^{(5,4)}, \mu^{(6,0)}, \mu^{(6,1)}, \mu^{(6,3)}, \mu^{(7,0)}, \mu^{(7,1)}, \mu^{(7,5)}\}$.

Step 302: Obtain different length vectors corresponding to the root leader vector of the lattice vector quantizers of different NCBs.

For example, in this embodiment, in the length vectors of the root leader vector corresponding to the lattice vector quantizers of different NCBs, $W^{(0,0)}, W^{(3,0)}$, and $W^{(7,1)}$ are the same. Therefore, only $W^{(0,0)}$ is obtained as an eigenvector. Through comparison in step 302, 39 length vectors independent of each other are obtained:

$\{W^{(0,0)}, W^{(1,0)}, W^{(1,1)}, W^{(1,2)}, W^{(2,0)}, W^{(2,1)}, W^{(2,2)}, W^{(3,1)}, W^{(3,2)}, W^{(3,3)}, W^{(4,0)}, W^{(4,1)}, W^{(4,2)}, W^{(4,4)}, W^{(4,5)}, W^{(5,0)}, W^{(5,1)}, W^{(5,2)}, W^{(5,3)}, W^{(5,4)}, W^{(5,5)}, W^{(5,6)}, W^{(6,1)}, W^{(6,2)}, W^{(6,5)}, W^{(6,6)}, W^{(6,7)}, W^{(6,9)}, W^{(6,11)}, W^{(7,12)}, W^{(7,3)}, W^{(7,4)}, W^{(7,6)}, W^{(7,7)}, W^{(7,8)}, W^{(7,9)}, W^{(7,10)}, W^{(7,11)}, W^{(7,12)}\}$

Step 303: Obtain different amplitude vectors and length vectors (which serve as eigenvectors) corresponding to the root leader vector of the lattice vector quantizers of the same NCB.

For example, in this embodiment, the amplitude vector $\mu^{(0,0)}$ of the root leader vector corresponding to the lattice vector quantizer of NCB "9" is the same as the length vector $W^{(0,0)}$ of the root leader vector corresponding to the lattice vector quantizer of NCB "9". Therefore, only one of them is obtained as an eigenvector. By analogy, through step 303, it is not necessary to obtain $W^{(0,0)}, W^{(1,0)}$, and $W^{(1,1)}$ any more.

Step 304: Obtain different amplitude vectors and length vectors (which serve as eigenvectors) corresponding to the root leader vector of the lattice vector quantizers of different NCBs.

For example, in this embodiment, the amplitude vector $\mu^{(2,0)}$ of the root leader vector corresponding to the lattice vector quantizer of NCB "21" is the same as the length vector $W^{(7,6)}$ of the root leader vector corresponding to the lattice vector quantizer of NCB "32". Therefore, only one of them is obtained as an eigenvector. By analogy, through step 304, it is not necessary to obtain $W^{(2,1)}$, $W^{(3,2)}$, and $W^{(7,6)}$ any more.

It should be noted that step 301, step 302, step 303, and step 304 may be performed simultaneously or any one of the four steps may be performed first. The preceding four steps are numbered here for ease of description. In practice, the four steps are not order-sensitive.

The finally obtained eigenvector set is:
$\{\mu^{(0,0)}, \mu^{(1,0)}, \mu^{(1,2)}, \mu^{(2,0)}, \mu^{(2,2)}, \mu^{(4,0)}, \mu^{(4,3)}, \mu^{(5,4)}, \mu^{(6,0)},$
$\mu^{(6,1)}, \mu^{(6,3)}, \mu^{(7,0)}, \mu^{(7,1)}, \mu^{(7,5)}, W^{(1,2)}, W^{(2,0)}, W^{(2,2)},$
$W^{(3,1)}, W^{(3,3)}, W^{(4,0)}, W^{(4,1)}, W^{(4,2)}, W^{(4,4)}, W^{(4,5)},$
$W^{(5,0)}, W^{(5,1)}, W^{(5,2)}, W^{(5,3)}, W^{(5,4)}, W^{(5,5)}, W^{(5,6)},$
$W^{(6,1)}, W^{(6,2)}, W^{(6,5)}, W^{(6,6)}, W^{(6,7)}, W^{(6,9)}, W^{(6,11)},$
$W^{(7,2)}, W^{(7,3)}, W^{(7,4)}, W^{(7,7)}, W^{(7,8)}, W^{(7,9)}, W^{(7,10)},$
$W^{(7,11)}, W^{(7,12)}\}$ In comparison with the second embodiment, six less eigenvectors are obtained through the foregoing steps. Therefore, in this embodiment, when the 16-dimensional multi-rate Gosset lattice vector quantizer has eight different NCBs, only 53−6=47 eigenvectors need to be stored.

Step 305: Store the eigenvector set and the storage addresses of all amplitude vectors and length vectors, where the all amplitude vectors and length vectors correspond to the root leader vector of the lattice vector quantizer and are in the eigenvector set.

Step 306: Obtain the amplitude vector set and the length vector set of the lattice vector quantizer of each NCB according to the storage addresses of the amplitude vectors and length vectors in the eigenvector set.

Step 307: Generate the codebook of the lattice vector quantizer of each NCB according to the amplitude vector set and the length vector set.

The codebooks corresponding to the lattice vector quantizers of different NCBs are generated according to the eigenvector set. In practice, the codebooks may be generated with reference to the addresses of the amplitude vectors and length vectors in the eigenvector set, where the amplitude vectors and length vectors correspond to the root leader vector included in the lattice vector quantizer of each NCB.

In comparison with the previous embodiment, two more steps are performed in obtaining the eigenvector set in this embodiment. Therefore, the obtained eigenvectors are fewer than those obtained in the second embodiment. If more substeps (namely, decision conditions) are performed in obtaining the eigenvector set, fewer eigenvectors will be obtained, and more storage overheads are reduced. This embodiment makes use of the codebook correlation between the multi-rate lattice vector quantizers of different NCBs, and uses an eigenvector set to generate the codebook of the lattice vector quantizer of each NCB, thus reducing the storage overhead of the quantizer in the process of generating the codebook. In this embodiment, after the 16-dimensional 8-rate Gosset lattice vector quantizer makes comparison through the four substeps, the result of comparison is consistent with the result obtained through six substeps in the previous embodiment. Therefore, after the comparison is made through the four substeps, the minimum eigenvector set is also obtained.

It should be noted that for ease of description in the preceding method embodiments, the method is described as a series of operations. It is apparent to those skilled in the art that the operations are not order-sensitive and may occur simultaneously or in other order. Meanwhile, those skilled in the art are aware that the embodiments described herein are exemplary embodiments, and that the involved operations and modules are not mandatory.

Figure 4:
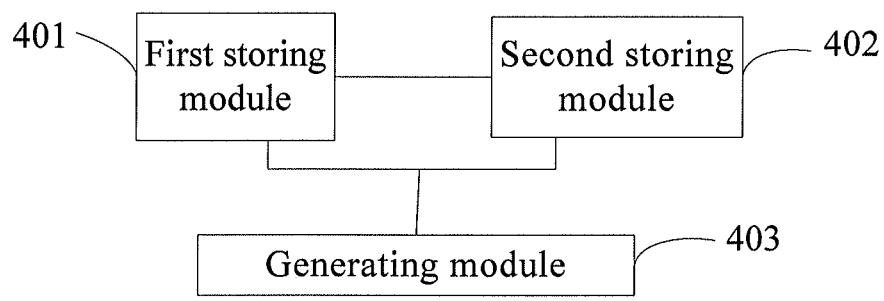
FIG. 4 is a schematic structural diagram of an apparatus for generating a lattice vector quantizer codebook according to a first embodiment of the present invention.

Corresponding to the preceding method, an embodiment of the present invention also provides an apparatus for generating a lattice vector quantizer codebook. As shown in FIG. 4, the apparatus may include a first storing module 401, a second storing module 402, and a generating module 403.

The first storing module 401 is configured to store an eigenvector set that includes amplitude vectors and/or length vectors, where the amplitude vectors and/or length vectors are different from each other and correspond to a root leader of a lattice vector quantizer.

In this embodiment, the eigenvector set includes the amplitude vectors and/or length vectors, where the amplitude vectors and/or length vectors are different from each other and correspond to the root leader. In practice, the amplitude vector corresponding to the root leader vector represents the values of different nonzero elements in the corresponding root leader vector, and the values of the elements are arranged in descending order. The length vector corresponding to the root leader vector represents the count of occurrences of each nonzero element value in the corresponding root leader vector. Supposing that the codebook corresponding to the lattice vector quantizer of $NCB_i$ is $Q_{R_i}^N$, the codebook may be generated through a root leader vector numbered $L_i$. The root leader vector numbered k may be calculated according to the corresponding amplitude vector $\mu^{(i,k)} = [\mu_0^{(i,k)} \ \mu_1^{(i,k)} \ \ldots \ \mu_{L_p^{(i,k)}-1}^{(i,k)}]$ and length vector $W^{(i,k)} = [w_0^{(i,k)} \ w_1^{(i,k)} \ \ldots \ w_{L_p^{(i,k)}-1}^{(i,k)}]$, where $k \in [0, L_i-1]$, and $L_p^{(i,k)}$ is the number of dimensions of the amplitude vector and length vector of the root leader vector numbered k corresponding to the lattice vector quantizer of $NCB_i$, and represents the number of elements with different values in the root leader vector.

The eigenvector set includes the amplitude vectors and/or length vectors, where the amplitude vectors and/or length vectors are different from each other and correspond to the root leader. The content in the eigenvector set may be expressed as $\{x^{(0)}, x^{(1)}, \ldots, x^{(j)}, \ldots, x^{(L_\mu-1)}, y^{(0)}, y^{(1)}, \ldots, y^{(j)}, \ldots, y^{(L_w-1)}\}$. The lattice vector quantizer stores the eigenvector set, namely, stores the different amplitude vectors and/or length vectors.

The second storing module 402 is configured to store the storage addresses of the amplitude vectors and length vectors, where the amplitude vectors and length vectors correspond to the root leader and are in the eigenvector set.

In this embodiment, it is necessary to store the storage addresses of all amplitude vectors and length vectors of the root leader according to the eigenvector set. At the time of calculating the complete length vectors or amplitude vectors corresponding to the lattice vector quantizer of each NCB, the length vectors and the amplitude vectors corresponding to the lattice vector quantizer of each NCB can be obtained according to the length vectors and/or amplitude vectors stored in the eigenvector set and the storage addresses of all amplitude vectors and/or length vectors.

The generating module 403 is configured to generate a lattice vector quantizer codebook according to the eigenvector set and the storage addresses.

The amplitude vectors and length vectors, where the amplitude vectors and length vectors correspond to the lattice vector quantizer of each NCB, can be obtained according to the stored eigenvector set and the storage addresses of all amplitude vectors and length vectors; the corresponding root leader vector can be calculated according to the amplitude vectors and length vectors, where the amplitude vectors and length vectors correspond to the root leader vector of the lattice vector quantizer of each NCB; and the signs and positions of the elements of the root leader vector can be transformed in different ways to generate the codebook of the lattice vector quantizer of each specified NCB. For example, the lattice vector quantizer whose NCB is R1 includes two root leader vectors. The length vector corresponding to the root leader vector numbered 0 is the same as $x^{(2)}$, and the amplitude vector corresponding to the root leader vector numbered 0 is the same as $y^{(1)}$; the length vector corresponding to the root leader vector numbered 1 is the same as $y^{(2)}$, and the amplitude vector corresponding to the root leader vector numbered 1 is the same as $x^{(1)}$. Therefore, $\{x^{(2)}, y^{(1)}\}$ is the amplitude vector set corresponding to the lattice vector quantizer whose NCB is R1, and $\{y^{(1)}, x^{(1)}\}$ is the length vector set. Further, the corresponding root leader vector is generated according to the amplitude vector set and the length vector set, and the codebook is generated accordingly.

In the first embodiment of the present invention, in the N-dimensional multi-rate coding lattice vector quantizer, the eigenvectors can be stored independently between the lattice vector quantizers of different NCBs, and the codebooks are generated according to the eigenvectors. When the vector quantizer includes many different rates, the storage overhead for storing the eigenvectors is rather heavy in the process of generating the codebook. In this embodiment, however, by making use of the codebook correlation between the lattice vector quantizers of different NCBs, the apparatus stores only the eigenvectors which vary between the lattice vector quantizers of different NCBs, thus reducing the storage overhead of the multi-rate coding lattice vector quantizer.

Figure 5:
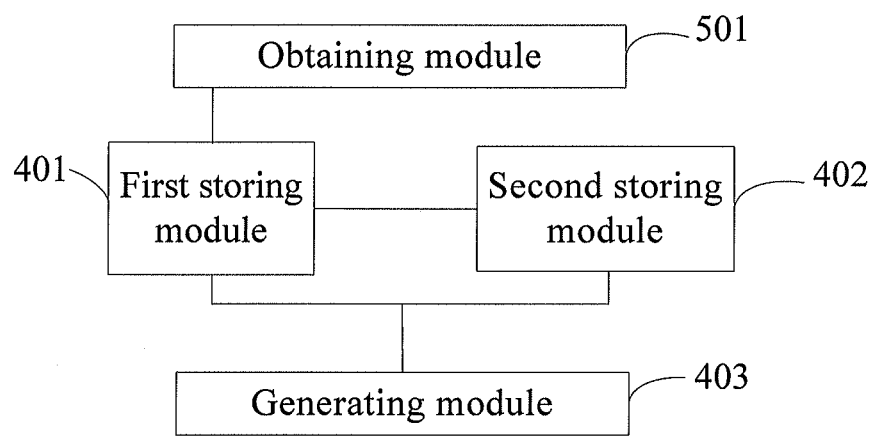
FIG. 5 is a schematic structural diagram of an apparatus for generating a lattice vector quantizer codebook according to a second embodiment of the present invention.

Corresponding to the second method embodiment of the present invention, a second apparatus embodiment is shown in FIG. 5. The apparatus may include an obtaining module 501, a first storing module 401, a second storing module 402, and a generating module 403.

The obtaining module 501 is configured to obtain the eigenvector set corresponding to the root leader of the lattice vector quantizer.

Specifically, the obtaining module 501 is configured to obtain the amplitude vectors and/or length vectors corresponding to the root leader of the lattice vector quantizer that satisfies a decision condition. The decision condition may be: the amplitude vector of the root leader varies between the lattice vector quantizers of different NCBs; and/or the length vector of the root leader varies between the lattice vector quantizers of different NCBs.

In this embodiment, the 16-dimensional multi-rate Gosset lattice vector quantizer is taken as an example. The quantizer includes eight different NCBs: 9 bits, 16 bits, 21 bits, 23 bits, 26 bits, 28 bits, 30 bits, and 32 bits. The codebook of the lattice vector quantizer of each NCB can be generated out of the corresponding root leader vector through transformation of positions and signs of elements. The root leader vector can be expressed by amplitude vectors and length vectors.

The first storing module 401 is configured to store an eigenvector set that includes amplitude vectors and/or length vectors, where the amplitude vectors and/or length vectors are different from each other and correspond to a root leader of a lattice vector quantizer.

The second storing module 402 is configured to store the storage addresses of the amplitude vectors and length vectors, where the amplitude vectors and length vectors correspond to the root leader and are in the eigenvector set.

The generating module 403 is configured to generate a lattice vector quantizer codebook according to the eigenvector set and the storage addresses.

Finally, the codebooks corresponding to the lattice vector quantizers of different NCBs are generated according to the amplitude vector set and the length vector set. In practice, the root leader vector of the lattice vector quantizer of each NCB can be obtained according to the amplitude vector set and length vector set; the corresponding root leader vector can be calculated according to the amplitude vectors and length vectors, where the amplitude vectors and length vectors correspond to the root leader vector of the lattice vector quantizer of each NCB; and the signs and positions of the elements of the root leader vector can be transformed in different ways to generate codebook of the lattice vector quantizer of each specified NCB.

In this embodiment, taking the 16-dimensional multi-rate Gosset lattice vector quantizer as an example, if the amplitude vectors and length vectors, where the amplitude vectors and length vectors correspond to the root leader vector of the lattice vector quantizer of each NCB, are stored directly, and the codebooks corresponding to the lattice vector quantizers of different NCBs are generated according to the amplitude vectors and length vectors, it is necessary to store 49 amplitude vectors and 49 length vectors. In this embodiment, however, only 53 eigenvectors need to be stored, and the codebook corresponding to the lattice vector quantizer of each NCB can be generated according to the 53 eigenvectors in the subsequent process of generating the codebook. Evidently, the eigenvector storage mode in this embodiment reduces the storage overhead of the lattice vector quantizer.

Figure 6:
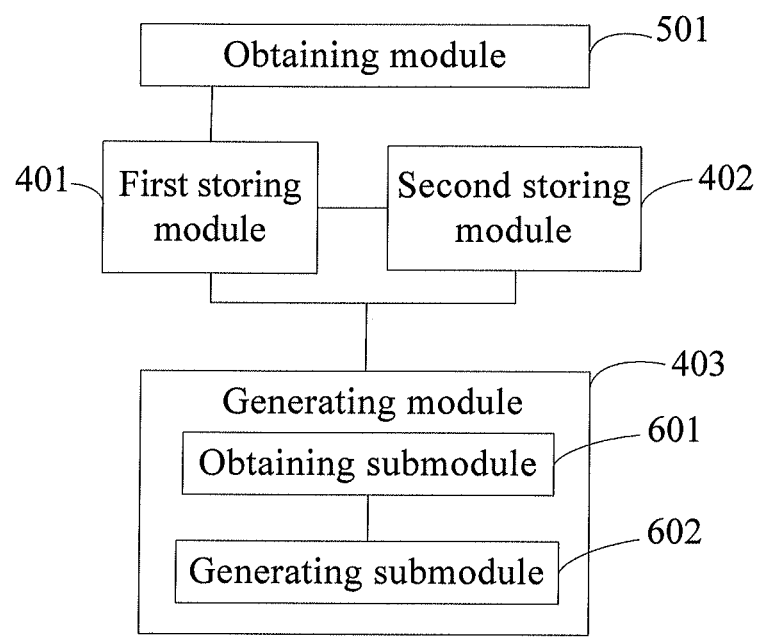
FIG. 6 is a schematic structural diagram of an apparatus for generating a lattice vector quantizer codebook according to a third embodiment of the present invention.

FIG. 6 shows a schematic structural diagram of the third apparatus embodiment of the present invention. As shown in FIG. 6, the apparatus may include an obtaining module 501, a first storing module 401, a second storing module 402, and a generating module 403.

The obtaining module 501 is configured to obtain the amplitude vectors and/or length vectors corresponding to the root leader of the lattice vector quantizer that satisfies a decision condition. The decision condition may be any one or combination of the following:

the amplitude vector of the root leader varies between the lattice vector quantizers of different NCBs;

the length vector of the root leader varies between the lattice vector quantizers of different NCBs;

the amplitude vector of the root leader varies between the lattice vector quantizers of the same NCB;

the length vector of the root leader varies between the lattice vector quantizers of the same NCB;

the amplitude vector and the length vector of the root leader vary between the lattice vector quantizers of the same NCB; and the amplitude vector and the length vector of the root leader vary between the lattice vector quantizers of different NCBs.

The first storing module 401 is configured to store an eigenvector set that includes amplitude vectors and/or length vectors, where the amplitude vectors and/or length vectors are different from each other and correspond to a root leader of a lattice vector quantizer.

The second storing module 402 is configured to store the storage addresses of the amplitude vectors and length vectors, where the amplitude vectors and length vectors correspond to the root leader and are in the eigenvector set.

The generating module 403 may include an obtaining submodule 601 and a generating submodule 602. The obtaining submodule 601 is configured to obtain the amplitude vector set and the length vector set of the lattice vector quantizer of each NCB according to the storage addresses of the amplitude vectors and length vectors in the eigenvector set.

The generating submodule 602 is configured to generate the lattice vector quantizer codebook according to the amplitude vector set and the length vector set.

It should be noted that in the description herein, the terms like "first" and "second" are used to differentiate one entity or one operation from another entity or another operation, and not necessarily construed as any practical relation or order between the entities or operations. Moreover, the terms "include", "comprise" and any variation thereof refer to "including but not limited to". Therefore, in the context of a process, method, object or device that includes a series of elements, the process, method, object or device not only includes such elements, but also includes other elements not specified expressly, or may include inherent elements of the process, method, object or device. Unless otherwise specified, in the context of a process, method, object or device that "includes an" or "comprises an" element, the process, method, object or device that includes the specified element may include other elements of the same nature.

Persons of ordinary skill in the art should understand that all or part of the steps of the method in the embodiments of the present invention may be implemented by a program instructing relevant hardware. The program may be stored in a computer readable storage medium. The storage medium may be a Read Only Memory (ROM), a Random Access Memory (RAM), a magnetic disk, or a Compact Disk-Read Only Memory (CD-ROM).

Described above are a method and an apparatus for generating a lattice vector quantizer codebook provided in the embodiments of the present invention. Although the principle and implementation mode of the present invention are described through some exemplary embodiments, the preceding embodiments are only used to help understand the method and idea of the present invention. Meanwhile, it is apparent that those of ordinary skill in the art can make modifications and variations to the invention without departing from the spirit and scope of the invention. The invention is intended to cover the modifications and variations provided that they fall within the protection scope of the invention defined by the following claims or their equivalents. The invention is not limited to such embodiments.

What is claimed is:

1. A method for generating a lattice vector quantizer codebook, comprising:
   storing an eigenvector set that comprises at least one of an amplitude vector and a length vector, wherein the amplitude vector and/or the length vector are different from each other;
   before the storing of the eigenvector set, obtaining the eigenvector set corresponding to a root leader of the lattice vector quantizer;
   storing storage addresses of the amplitude vector and the length vector located in the eigenvector set, wherein the amplitude vector and length vector each corresponds to a the root leader of a lattice vector quantizer; and
   generating a lattice vector quantizer codebook according to the eigenvector set and the storage addresses;
   wherein the process of obtaining the eigenvector set corresponding to the root leader of the lattice vector quantizer comprises obtaining the at least one amplitude vector and the length vector which satisfies a decision condition; and
   wherein the decision condition comprises the following:
   the length vector of the root leader which varies between lattice vector quantizers of different Numbers of Code Bits (NCBs);
   the amplitude vector of the root leader which varies between the lattice vector quantizers of different NCBs;
   the amplitude vector of the root leader which varies between the lattice vector quantizers of the same NCB;
   the length vector of the root leader which varies between the lattice vector quantizers of the same NCB;
   the amplitude vector and the length vector of the root leader which vary between the lattice vector quantizers of the same NCB; and
   the amplitude vector and the length vector of the root leader which vary between the lattice vector quantizers of different NCBs.

2. The method according to claim 1, wherein:
   the lattice vector quantizer is a multi-rate lattice vector quantizer, and the generating of the lattice vector quantizer codebook according to the eigenvector set and the storage addresses comprising:
   obtaining an amplitude vector set and a length vector set corresponding to the root leader of the lattice vector quantizer of each NCB according to the storage addresses of the amplitude vector and the length vector in the eigenvector set; and
   generating the lattice vector quantizer codebook according to the amplitude vector set and the length vector set.

3. The method according to claim 1, wherein:
   the amplitude vector represents values of different nonzero elements in a corresponding root leader vector, and the length vector represents a count of occurrences of each nonzero element value in the corresponding root leader vector.

4. An apparatus for generating a lattice vector quantizer codebook, comprising:
   a first storing module, configured to store an eigenvector set that comprises at least one of an amplitude vector and a length vector, wherein the amplitude vector and/or length vector are different from each other;
   a second storing module, configured to store storage addresses of the amplitude vector and the length vector located in the eigenvector set, wherein the amplitude vector and the length vector each corresponds to a root leader of a lattice vector quantizer;
   a generating module, configured to generate a lattice vector quantizer codebook according to the eigenvector set and the storage addresses; and
   an obtaining module, configured to obtain the eigenvector set corresponding to the root leader of the lattice vector quantizer;
   wherein the obtaining module is configured to obtain the at least one amplitude vector and the length vector which satisfies a decision condition; and
   wherein the decision condition comprises the following:
   the amplitude vector of the root leader which varies between lattice vector quantizers of different Numbers of Code Bits (NCBs);
   the length vector of the root leader which varies between the lattice vector quantizers of different NCBs;
   the amplitude vector of the root leader which varies between the lattice vector quantizers of the same NCB;
   the length vector of the root leader which varies between the lattice vector quantizers of the same NCB;
   the amplitude vector and the length vector of the root leader which vary between the lattice vector quantizers of the same NCB; and the amplitude vector and the length vector of the root leader which vary between the lattice vector quantizers of different NCBs.

5. The apparatus according to claim 4, wherein the generating module comprises:
a second obtaining submodule, configured to obtain an amplitude vector set and a length vector set corresponding to the root leader of the lattice vector quantizer of each NCB according to the storage addresses of the amplitude vector and the length vector in the eigenvector set; and
a generating submodule, configured to generate the lattice vector quantizer codebook according to the amplitude vector set and the length vector set.

6. The apparatus according to claim 4, wherein:
the amplitude vector represents values of different nonzero elements in a corresponding root leader vector, and the length vector represents a count of occurrences of each nonzero element value in the corresponding root leader vector.

7. A method for generating lattice vector quantizer codebooks, comprising:
obtaining storage addresses in an eigenvector set, wherein the eigenvector set comprises at least one of an amplitude vector and a length vector, where the amplitude vector and the length vector each corresponds to a root leader of a lattice vector quantizer;
obtaining an amplitude vector set and a length vector set corresponding to the root leader of the lattice vector quantizer according to the storage addresses of the amplitude vector and the length vector located in the eigenvector set;
generating the lattice vector quantizer codebooks according to the eigenvector set and the storage addresses; wherein the amplitude vector represents values of different nonzero elements in a corresponding root leader vector, and the length vector represents a count of occurrences of each nonzero element value in the corresponding root leader vector; and
obtaining and storing the eigenvector set corresponding to the root leader of the lattice vector quantizer;
wherein the process of obtaining the eigenvector set corresponding to the root leader of the lattice vector quantizer comprises obtaining the at least one amplitude vector and the length vector which satisfies a decision condition; and
wherein the decision condition includes the following:
the length vector of the root leader which varies between lattice vector quantizers of different Numbers of Code Bits (NCBs);
the amplitude vector of the root leader which varies between the lattice vector quantizers of different NCBs;
the amplitude vector of the root leader which varies between the lattice vector quantizers of the same NCB;
the length vector of the root leader which varies between the lattice vector quantizers of the same NCB;
the amplitude vector and the length vector of the root leader which vary between the lattice vector quantizers of the same NCB; and
the amplitude vector and the length vector of the root leader which vary between the lattice vector quantizers of different NCBs.

8. The method according to claim 1, wherein the storing of storage addresses of the amplitude vector and the length vector located in the eigenvector set takes place before the storing of the eigenvector set.

* * * * *